(12) United States Patent
Choi et al.

(10) Patent No.: US 11,502,349 B2
(45) Date of Patent: Nov. 15, 2022

(54) COOLING MANIFOLD ASSEMBLY

(71) Applicant: BorgWarner, Inc., Auburn Hills, MI (US)

(72) Inventors: Edward Choi, Lake Orion, MI (US); Gary Peter Squire, Sacriston (GB); Lidia María Fontán Martínez, Vigo (ES); Iago González Tabarés, Vigo (ES)

(73) Assignee: BORGWARNER, INC., Auburn Hills, MI (US)

( * ) Notice: Subject to any disclaimer, the term of this patent is extended or adjusted under 35 U.S.C. 154(b) by 75 days.

(21) Appl. No.: 17/007,194

(22) Filed: Aug. 31, 2020

(65) Prior Publication Data
US 2022/0069384 A1 Mar. 3, 2022

(51) Int. Cl.
| | |
|---|---|
| *H01M 10/613* | (2014.01) |
| *H01M 10/6554* | (2014.01) |
| *H01M 10/6557* | (2014.01) |
| *H01M 10/6568* | (2014.01) |
| *H01M 10/647* | (2014.01) |
| *H01M 10/625* | (2014.01) |

(52) U.S. Cl.
CPC ..... *H01M 10/6568* (2015.04); *H01M 10/613* (2015.04); *H01M 10/625* (2015.04); *H01M 10/647* (2015.04); *H01M 2220/20* (2013.01)

(58) Field of Classification Search
None
See application file for complete search history.

(56) References Cited

U.S. PATENT DOCUMENTS

| | | |
|---|---|---|
| 3,648,113 A | 3/1972 | Rathjen et al. |
| 4,186,422 A | 1/1980 | Laermer |
| 4,420,739 A | 12/1983 | Herren |
| 4,631,573 A | 12/1986 | Sutrina |
| 4,841,355 A | 6/1989 | Parks |
| 5,424,916 A | 6/1995 | Martin |
| 5,737,186 A | 4/1998 | Fuesser et al. |
| 6,542,365 B2 | 4/2003 | Inoue |
| 6,611,057 B2 | 8/2003 | Mikubo et al. |
| 6,822,353 B2 | 11/2004 | Koga et al. |
| 6,828,675 B2 | 12/2004 | Memory et al. |

(Continued)

FOREIGN PATENT DOCUMENTS

| | | |
|---|---|---|
| EP | 0583301 B1 | 12/1994 |
| EP | 0841842 B1 | 8/2001 |

(Continued)

*Primary Examiner* — Lisa S Park
(74) *Attorney, Agent, or Firm* — Reising Ethington P.C.

(57) ABSTRACT

A cooling manifold assembly that is configured to cool power modules in a vehicle includes a planar cooling chamber with a supply inlet and a return outlet; a supply chamber in an upper portion of the planar cooling chamber that is in fluid communication with the supply inlet and configured to couple to adjacent planar cooling chambers at the supply inlet; a return chamber in a lower portion of the planar cooling chamber that is in fluid communication with the return outlet and configured to couple to adjacent planar cooling chambers at the return outlet; and an opening at a distal end of the planar cooling chamber fluidly connecting the supply chamber with the return chamber.

20 Claims, 7 Drawing Sheets

(56) References Cited

U.S. PATENT DOCUMENTS

| | | |
|---|---|---|
| 6,845,012 B2 | 1/2005 | Ohkouchi |
| 7,027,302 B2 | 4/2006 | Inoue |
| 7,106,592 B2 | 9/2006 | Inoue et al. |
| 7,200,007 B2 | 4/2007 | Yasui et al. |
| 7,231,960 B2 | 6/2007 | Sakai |
| 7,245,493 B2 | 7/2007 | Inagaki et al. |
| 7,571,759 B2 | 8/2009 | Inagaki et al. |
| 7,687,181 B2 | 3/2010 | Osenar et al. |
| 7,745,035 B2 | 6/2010 | Yamauchi et al. |
| 7,823,671 B2 | 11/2010 | Inoue et al. |
| 7,835,151 B2 | 11/2010 | Olesen |
| 7,940,526 B2 | 5/2011 | Schulz-Harder et al. |
| 7,952,875 B2 | 5/2011 | Woody et al. |
| 8,151,868 B2 | 4/2012 | Inagaki |
| 8,159,823 B2 | 4/2012 | Murakami |
| 8,174,826 B2 | 5/2012 | El-Essawy et al. |
| 8,391,008 B2 | 3/2013 | Dede |
| 8,403,030 B2 | 3/2013 | Payne |
| 8,451,609 B2 | 5/2013 | Olesen et al. |
| 8,596,339 B2 | 12/2013 | Palanchon |
| 8,780,552 B2 | 7/2014 | El-Essawy et al. |
| 8,787,015 B2 | 7/2014 | El-Essawy et al. |
| 8,792,244 B2 | 7/2014 | Funatsu |
| 8,895,173 B2 | 11/2014 | Gandhi et al. |
| 8,971,041 B2 | 3/2015 | Sharaf et al. |
| 9,165,858 B2 | 10/2015 | Steger et al. |
| 9,320,182 B2 | 4/2016 | Steger et al. |
| 9,437,523 B2 | 9/2016 | Joshi et al. |
| 9,538,691 B2 | 1/2017 | Kikuchi et al. |
| 9,723,764 B2 | 8/2017 | Sugita |
| 9,847,734 B1 | 12/2017 | Lei et al. |
| 9,848,519 B2 | 12/2017 | Lei et al. |
| 9,867,319 B2 | 1/2018 | Lei et al. |
| 9,919,608 B2 | 3/2018 | Wang et al. |
| 9,941,187 B2 | 4/2018 | Yoshida |
| 9,941,234 B2 | 4/2018 | Liang |
| 9,950,628 B2 | 4/2018 | Lei et al. |
| 9,961,808 B2 | 5/2018 | Lei et al. |
| 10,000,126 B2 | 6/2018 | Lei et al. |
| 10,005,354 B2 | 6/2018 | Choi et al. |
| 10,014,794 B2 | 7/2018 | Lei et al. |
| 10,017,073 B2 | 7/2018 | Lei et al. |
| 10,037,977 B2 | 7/2018 | Lei et al. |
| 10,064,310 B2 | 8/2018 | Tanie et al. |
| 10,206,314 B2 | 2/2019 | Lei et al. |
| 10,314,207 B1 | 6/2019 | Skalski et al. |
| 10,405,466 B1* | 9/2019 | Pradeepkumar .... H01L 23/4006 |
| 10,422,592 B2 | 9/2019 | Deguchi |
| 10,475,724 B2 | 11/2019 | Machler et al. |
| 10,492,343 B2 | 11/2019 | Lei et al. |
| 10,605,545 B2 | 3/2020 | Meshenky |
| 2005/0133210 A1 | 6/2005 | Inagaki et al. |
| 2007/0044952 A1 | 3/2007 | Kuno et al. |
| 2010/0175857 A1 | 7/2010 | Gerstler et al. |
| 2011/0302773 A1* | 12/2011 | Chattot .............. H01M 50/502 |
| | | 29/729 |
| 2012/0028156 A1 | 2/2012 | Song et al. |
| 2012/0044647 A1 | 2/2012 | Lee et al. |
| 2013/0003301 A1 | 1/2013 | Miyamoto et al. |
| 2013/0011713 A1* | 1/2013 | Harada ............... H01M 10/613 |
| | | 429/120 |
| 2014/0313671 A1 | 10/2014 | Sugita et al. |
| 2015/0009624 A1 | 1/2015 | Dunwoody et al. |
| 2016/0079640 A1 | 3/2016 | Kim |
| 2016/0372805 A1* | 12/2016 | Kim .................. H01M 10/6568 |
| 2017/0259691 A1* | 9/2017 | Lei ................... H01M 10/6568 |
| 2019/0049195 A1 | 2/2019 | Meshenky |
| 2019/0115637 A1 | 4/2019 | Kim et al. |
| 2019/0126773 A1 | 5/2019 | Chung et al. |
| 2020/0006820 A1 | 1/2020 | Cha et al. |
| 2020/0169147 A1 | 5/2020 | Sohnle |

FOREIGN PATENT DOCUMENTS

| | | |
|---|---|---|
| EP | 1634329 A1 | 3/2006 |
| EP | 1825540 A2 | 8/2007 |
| EP | 1815514 B1 | 4/2008 |
| EP | 1965424 A2 | 9/2008 |
| EP | 1298975 B1 | 7/2009 |
| EP | 2094069 A1 | 8/2009 |
| EP | 1932407 B1 | 9/2011 |
| EP | 1502313 B1 | 2/2012 |
| EP | 2413422 A1 | 2/2012 |
| EP | 2432106 A1 | 3/2012 |
| EP | 1742265 B1 | 8/2013 |
| EP | 2645412 A1 | 10/2013 |
| EP | 2244289 B1 | 3/2014 |
| EP | 1148547 B1 | 8/2015 |
| EP | 2755841 B1 | 11/2015 |
| EP | 2234154 B1 | 3/2016 |
| EP | 2426780 B1 | 8/2016 |
| EP | 2272311 B1 | 10/2016 |
| EP | 2654392 B1 | 4/2018 |
| EP | 2654391 B1 | 11/2018 |
| EP | 3414509 A1 | 12/2018 |
| EP | 2315995 B1 | 6/2019 |
| WO | WO2018215117 A1 | 11/2018 |
| WO | WO2019007735 A1 | 1/2019 |
| WO | WO2019046012 A1 | 3/2019 |

* cited by examiner

COOLING MANIFOLD ASSEMBLY

TECHNICAL FIELD

The present application relates to power modules used with electric- or hybrid-electric vehicles and, more particularly, to a cooling manifold assembly used to remove heat from the power modules.

BACKGROUND

Electrical systems in vehicles powered by internal combustion engines (ICEs) have typically used a battery to facilitate ignition and provide electrical power to vehicle accessories. A level of battery charge is maintained by an alternator that is mechanically coupled to an output of the ICE. As the ICE operates, the output turns a rotor of the alternator thereby inducing the flow of current through windings in a stator. Passive electrical components are implemented as voltage regulators to apply the alternating current (AC) generated by the alternator to the direct current (DC) vehicle electrical system and battery.

Modern vehicles are increasingly propelled by one or more electrical motors powered by higher-voltage batteries. These vehicles are often referred to as electric vehicles (EV) or hybrid-electric vehicles (HEV) and include one or more power modules that regulate electrical power received from the vehicle battery to operate the electrical motors. The power modules may also control the electrical power generated by the electrical motor(s) that is used to charge the vehicle battery. Vehicle batteries used by EVs or HEVs may have a significantly higher voltage than those used with vehicles not powered by electrical motors. The electrical components included in the power modules may generate significant amounts of heat that reduce the performance of the modules. It is helpful to carry heat away from the power modules to improve performance of the power modules.

SUMMARY

In one implementation, a cooling manifold assembly that is configured to cool power modules in a vehicle includes a planar cooling chamber with a supply inlet and a return outlet; a supply chamber in an upper portion of the planar cooling chamber that is in fluid communication with the supply inlet and configured to couple to adjacent planar cooling chambers at the supply inlet; a return chamber in a lower portion of the planar cooling chamber that is in fluid communication with the return outlet and configured to couple to adjacent planar cooling chambers at the return outlet; and an opening at a distal end of the planar cooling chamber fluidly connecting the supply chamber with the return chamber.

In another implementation, a cooling manifold assembly is configured to cool power modules in a vehicle and includes a first planar cooling chamber with a first supply inlet having a first supply fluid inlet and a first supply fluid outlet, and a first return outlet having a first return fluid inlet and a first return fluid outlet, each located at a proximate end of the first planar cooling chamber; a first supply chamber in an upper portion of the first planar cooling chamber that is in fluid communication with the first supply inlet; a first return chamber in a lower portion of the first planar cooling chamber that is in fluid communication with the first return outlet; an opening at a distal end of the first planar cooling chamber fluidly connecting the first supply chamber with the first return chamber; a second planar cooling chamber including a second supply inlet having a second supply fluid inlet coupled with the first supply fluid outlet and a second supply fluid outlet, and a second return outlet having a second return fluid outlet coupled with the first return fluid inlet and a second return fluid inlet, each located at a proximate end of the second planar cooling chamber; a second supply chamber in an upper portion of the second planar cooling chamber that is in fluid communication with the second supply inlet; a second return chamber in a lower portion of the second planar cooling chamber that is in fluid communication with the second return outlet; and an opening at a distal end of the second planar cooling chamber fluidly connecting the second supply chamber with the second return chamber.

In yet another implementation, a cooling manifold assembly that is configured to cool power modules in a vehicle and includes a first planar cooling chamber including a first supply inlet having a first supply fluid inlet and a first supply fluid outlet, and a first return outlet having a first return fluid inlet and a first return fluid outlet, each located at a proximate end of the first planar cooling chamber; a first supply chamber in an upper portion of the first planar cooling chamber that is in fluid communication with the first supply inlet; a first return chamber in a lower portion of the first planar cooling chamber that is in fluid communication with the first return outlet; an opening at a distal end of the first planar cooling chamber fluidly connecting the first supply chamber with the first return chamber; a second planar cooling chamber including a second supply inlet having a second supply fluid inlet coupled with the first supply fluid outlet and a second supply fluid outlet, and a second return outlet having a second return fluid outlet coupled with the first return fluid inlet and a second return fluid inlet, each located at a proximate end of the second planar cooling chamber; a second supply chamber in an upper portion of the second planar cooling chamber that is in fluid communication with the second supply inlet; a second return chamber in a lower portion of the second planar cooling chamber that is in fluid communication with the second return outlet; and an opening at a distal end of the second planar cooling chamber fluidly connecting the second supply chamber with the second return chamber; and a compressive spring engaging an outer surface of the first planar cooling chamber and an outer surface of the second planar cooling chamber compressing one or more power modules between the first planar cooling chamber and the second planar cooling chamber.

DETAILED DESCRIPTION

Figure 1:
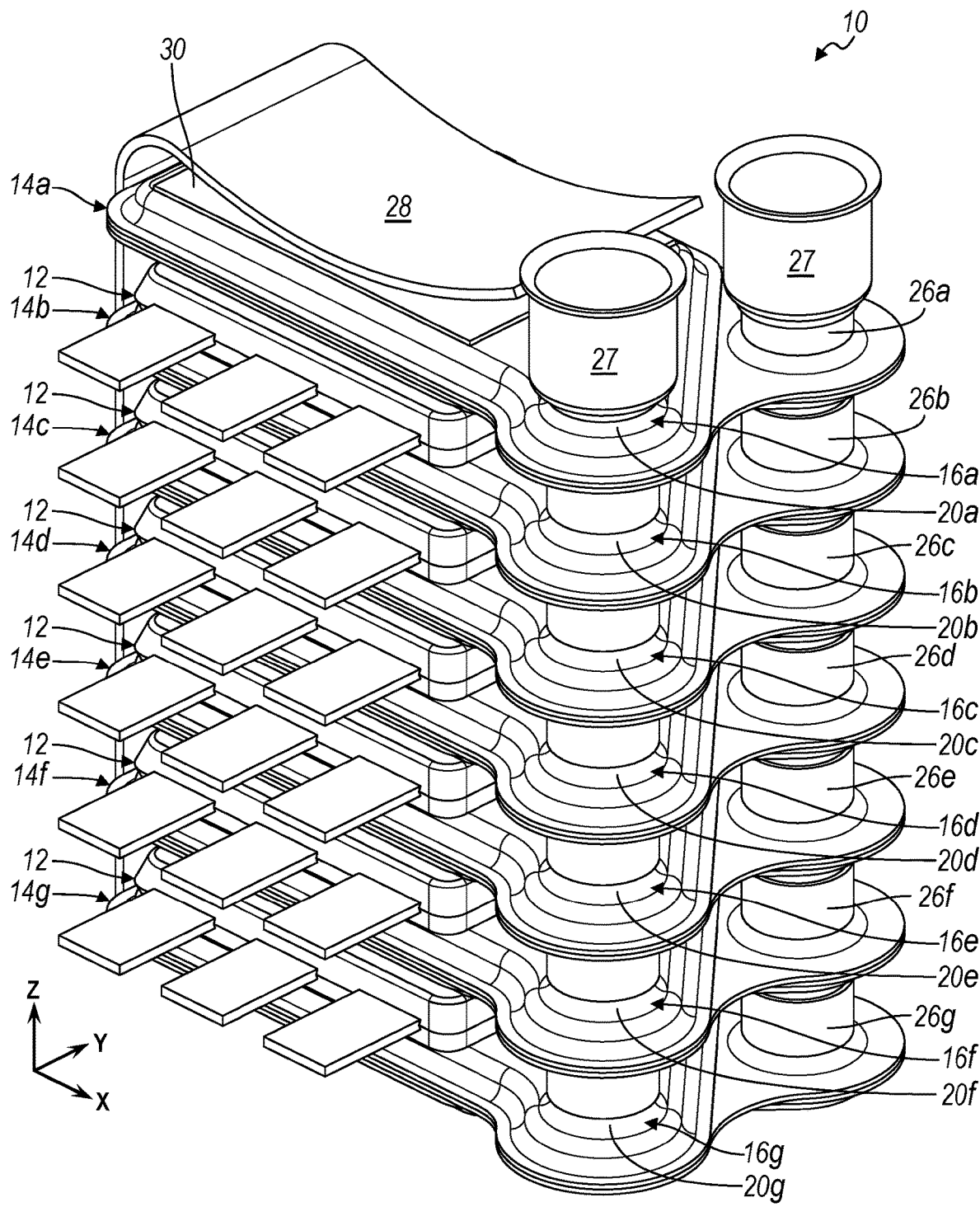
FIG. 1 is a perspective view depicting an implementation of a cooling manifold assembly along with power modules.

A cooling manifold assembly used in an electric vehicle (EV) or hybrid-electric vehicle (HEV) can cool power modules that regulate electrical power in such a vehicle. Electric motors used in electric- or hybrid-electric vehicles can be controlled by power modules that carry out a variety of functions. For example, power modules can invert electrical power from Direct Current (DC) stored in vehicle batteries to Alternating Current (AC) that induces electrical motor movement. Or power modules can function as a DC/DC converter or regulate on-board charging. The power modules can include IGBTs, diodes, and or MOSFETS to carry out electrical power regulation. While in use, the power modules can generate a significant amount of heat. Performance of the power modules can be improved by cooling the power modules or removing the heat generated by the power modules.

The cooling manifold assembly for cooling power modules includes a plurality of substantially planar cooling chambers. The planar cooling chambers directly abut outer surfaces of the power module(s). Each planar cooling chamber includes a supply chamber and a return chamber that extend through an upper portion and a lower portion of the planar cooling chamber, respectively, such that they fluidly connect at a distal end of the chamber. That is, the supply chamber is positioned above the return chamber. A supply inlet and a return outlet can both be positioned at a proximate end of the planar cooling chamber. However, it should be appreciated that other implementations are possible in which the supply inlet is positioned at a distal end of the planar cooling chamber while the return outlet is positioned at a proximate end of the chamber or the supply inlet is positioned at the proximate end of the planar cooling chamber while the return outlet is positioned at the distal end of the chamber. Cooling fluid can be supplied to the supply inlet that is in fluid communication with the supply chamber. The cooling fluid travels through the supply chamber toward the distal end where the fluid enters the return chamber where the supply chamber and return chamber fluidly connect and then begins travelling back toward the proximate end of the planar cooling chamber where the fluid can exit the return outlet.

A plurality of planar cooling chambers can be connected at their proximate ends via the supply inlets and the return outlets so that the chambers are connected in parallel such that cooling fluid supplied to the supply inlets may provide fluid to the supply chambers at substantially the same time. In that way, the supply inlet can include a supply fluid inlet that receives cooling fluid from a supply fluid outlet of an adjacent planar cooling chamber as well as a supply fluid output that provides cooling fluid to a supply fluid inlet of another adjacent cooling chamber. Similarly, the return outlet can include a return fluid inlet that receives cooling fluid from a return fluid outlet of an adjacent planar cooling chamber and a return fluid output that provides fluid to a return fluid inlet of another adjacent planar cooling chamber. Cooling fluid flows through the supply fluid inlets of the stacked planar cooling chambers and continues in a supply direction to provide cooling fluid for each of the planar cooling chambers. The cooling fluid then flows through the supply chambers in a direction substantially perpendicular to the supply direction to the return chambers at the distal end where the return chambers are fluidly connected to the supply chambers. The cooling fluid then flows through the return chambers in a direction substantially perpendicular to the return direction into the return fluid outlets—where the fluid ultimately leaves the cooling manifold assembly in a direction that can be substantially opposite to the flow of fluid through the supply fluid inlets. In other embodiments, the flow of fluid can be in a direction that is the same as the flow of fluid through the supply inlets.

The assembly of a plurality of planar cooling chambers can be coupled together so that they abut opposite sides of power modules. A plurality of power modules can be positioned in a coplanar arrangement in between adjacent planar cooling chambers so that the power modules abut the outer surfaces of opposing planar cooling chambers. A compressive spring can engage the outer planar cooling chambers of the cooling manifold assembly to compress the chambers 14 inward against the power modules. The arrangement of the power modules relative to the assembly of planar cooling chambers can provide the same relative temperature cooling performance regardless of the location of the power module in the assembly. The planar cooling chambers include a consistent temperature gradient from a proximate end of the chamber to a distal end when a plurality of the chambers are used to cool power modules. Cooling liquid can enter the supply chamber at its coolest temperature and as the liquid flows toward the distal end the cooling fluid gradually warms. Once the cooling fluid passes into the return chamber the cooling liquid continues increasing in temperature.

Power modules can be positioned in the cooling module assembly in a coplanar relationship along an axis from the proximate end of the planar cooling modules to the distal end of the modules. The power modules abut the outer surface of a planar cooling chamber that is adjacent a supply chamber as well as an outer surface of an adjacent planar cooling chamber that is adjacent a return chamber. Regardless of the position of each power module along the axis, each power module can receive the same cooling effect based on the relative cooler cooling fluid. For instance, the cooling module closest the supply inlet and return outlet may abut an outer surface of a planar cooling module supply chamber with cooling fluid at its coolest but also abut an outer surface of an adjacent cooling module return chamber with cooling liquid at its warmest. In contrast, the cooling module furthest from the supply inlet and return outlet and nearest the distal end may abut an outer surface of a planar cooling module supply chamber with cooling fluid at nearly the same temperature as the outer surface of an adjacent cooling module return chamber. The temperature gradient may be greatest nearest the supply inlet and return outlet and fall to near zero at the distal end thereby providing a relatively constant cooling effect along the axis.

Figure 2:
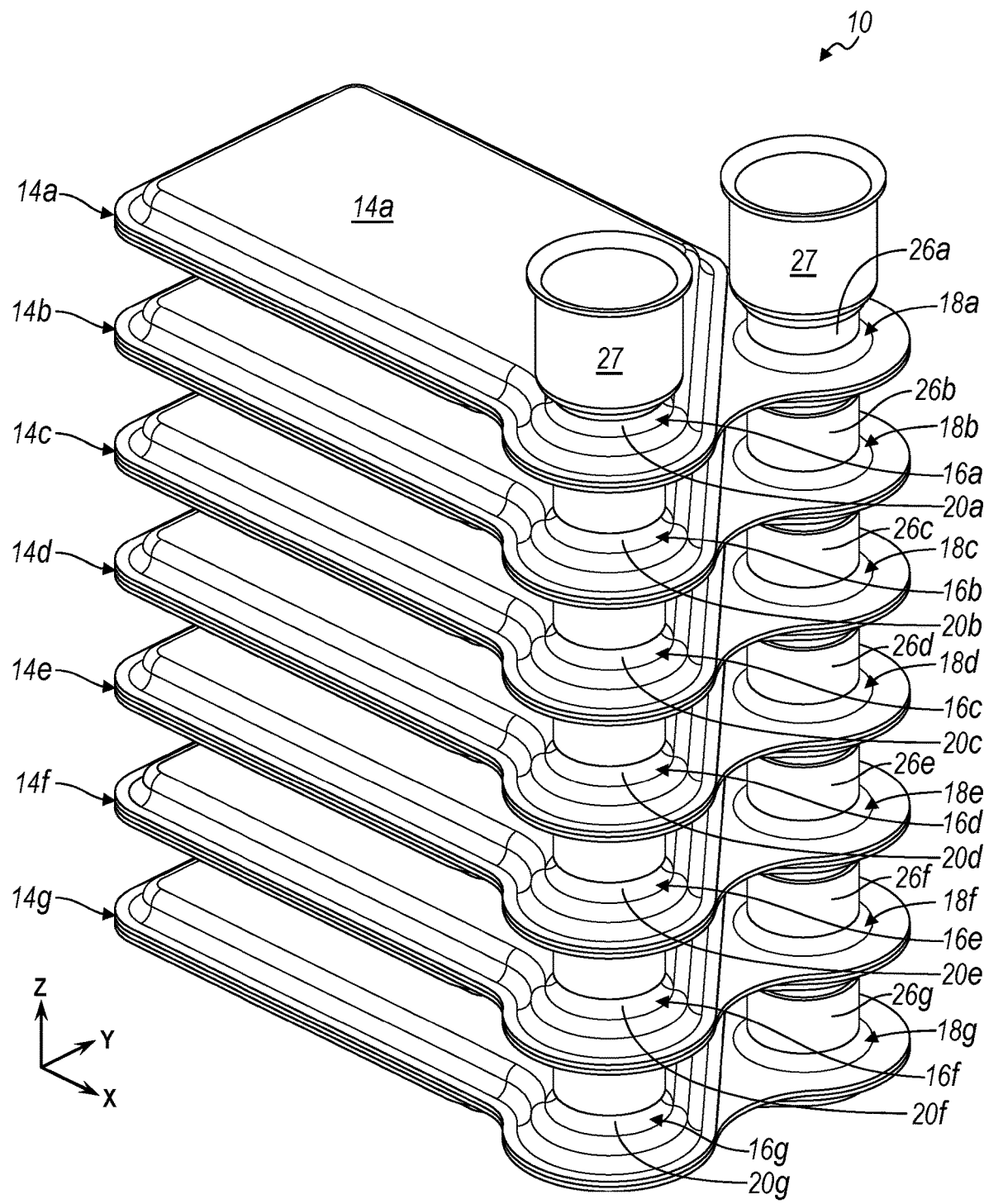
FIG. 2 is a perspective view depicting an implementation of a cooling manifold assembly.
Figure 3A:
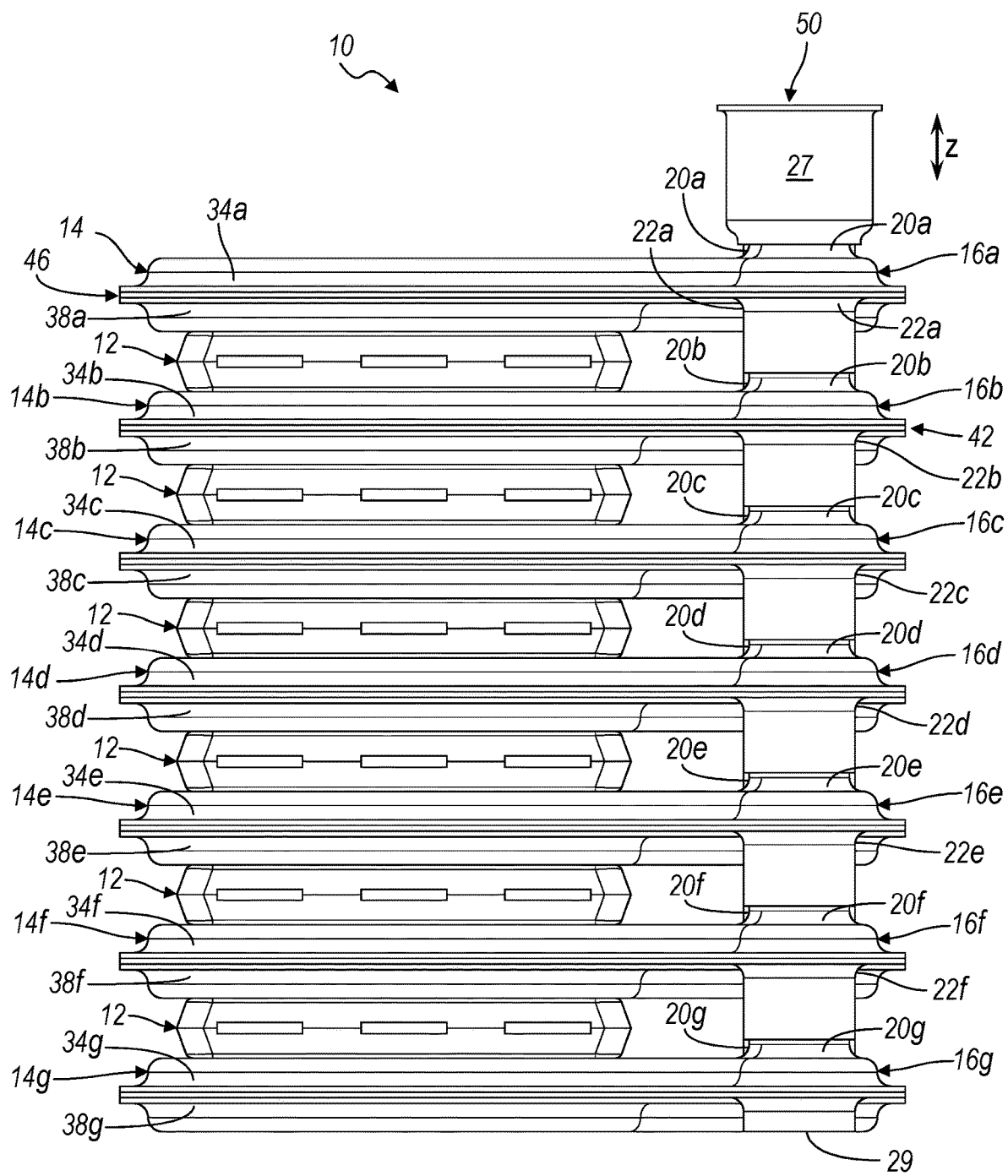
FIG. 3a is a profile view depicting an implementation of a cooling manifold assembly with power modules.
Figure 3B:
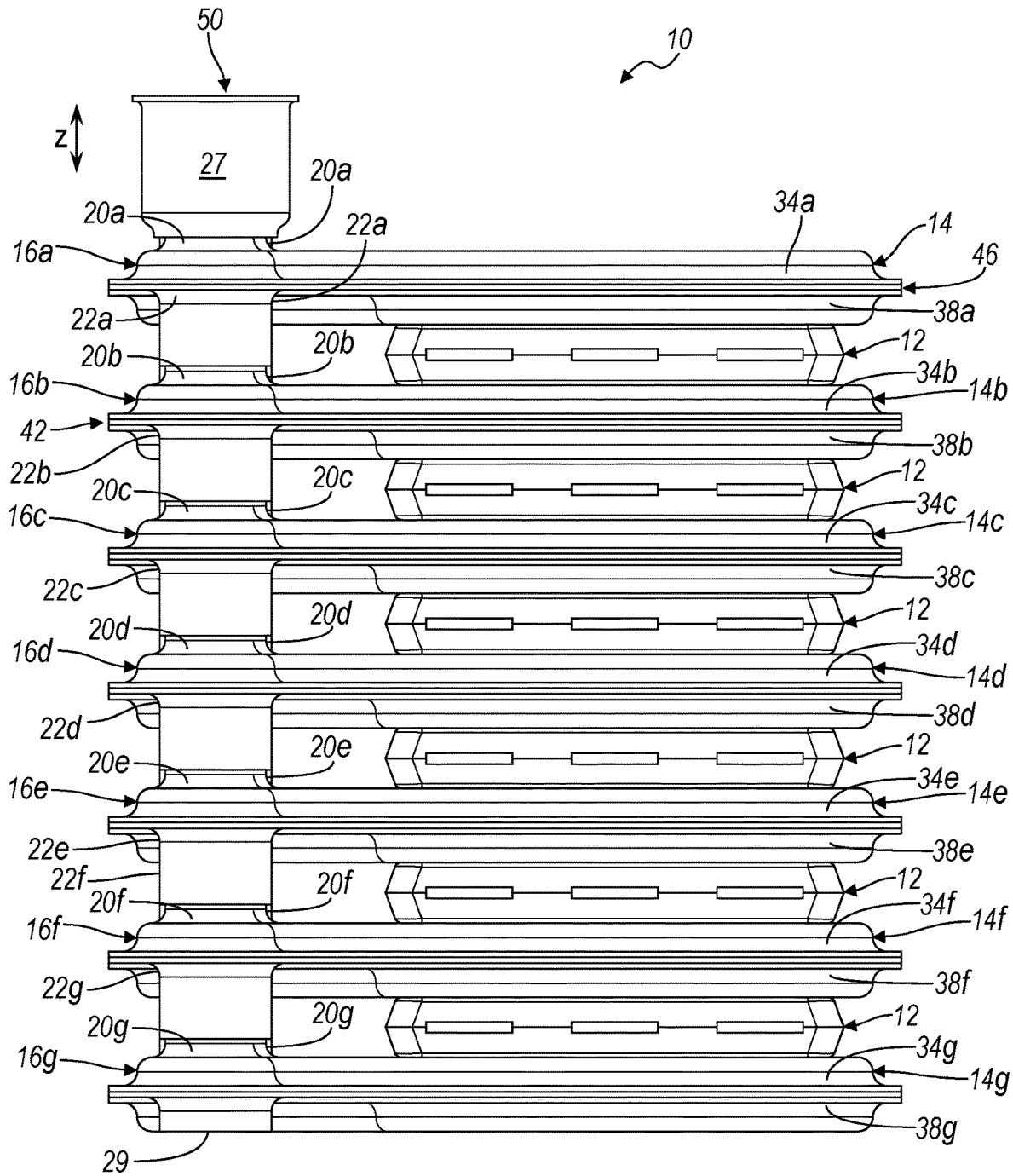
FIG. 3b is another profile view depicting an implementation of a cooling manifold assembly with power modules.
Figure 4:
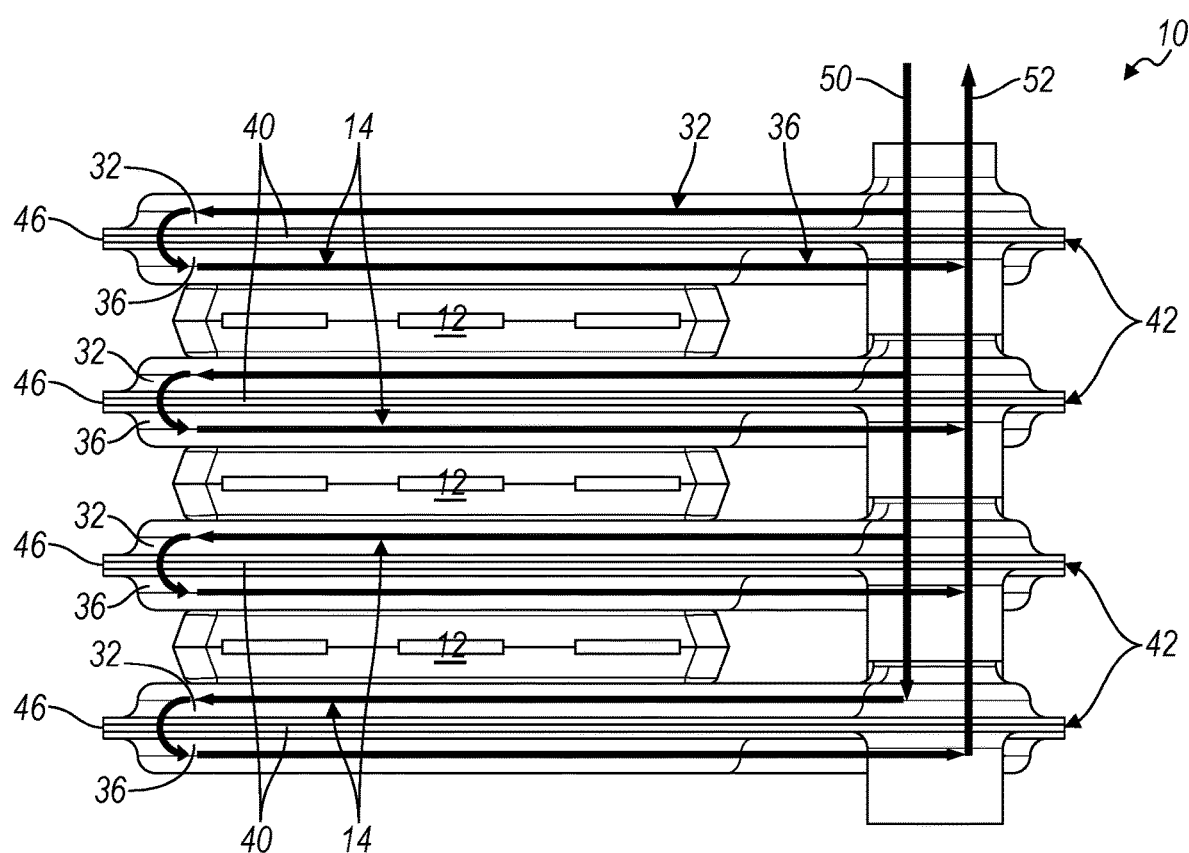
FIG. 4 is another profile view depicting an implementation of a cooling manifold assembly along with power modules.
Figure 5:
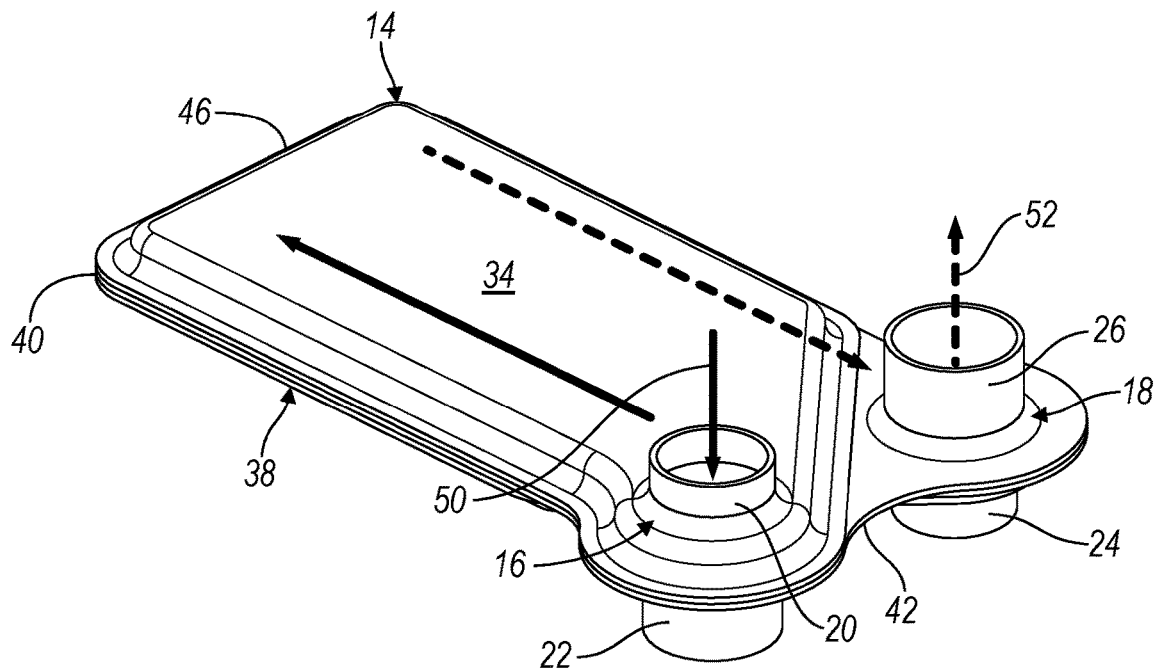
FIG. 5 is a perspective view depicting an implementation of a planar cooling chamber.
Figure 6:
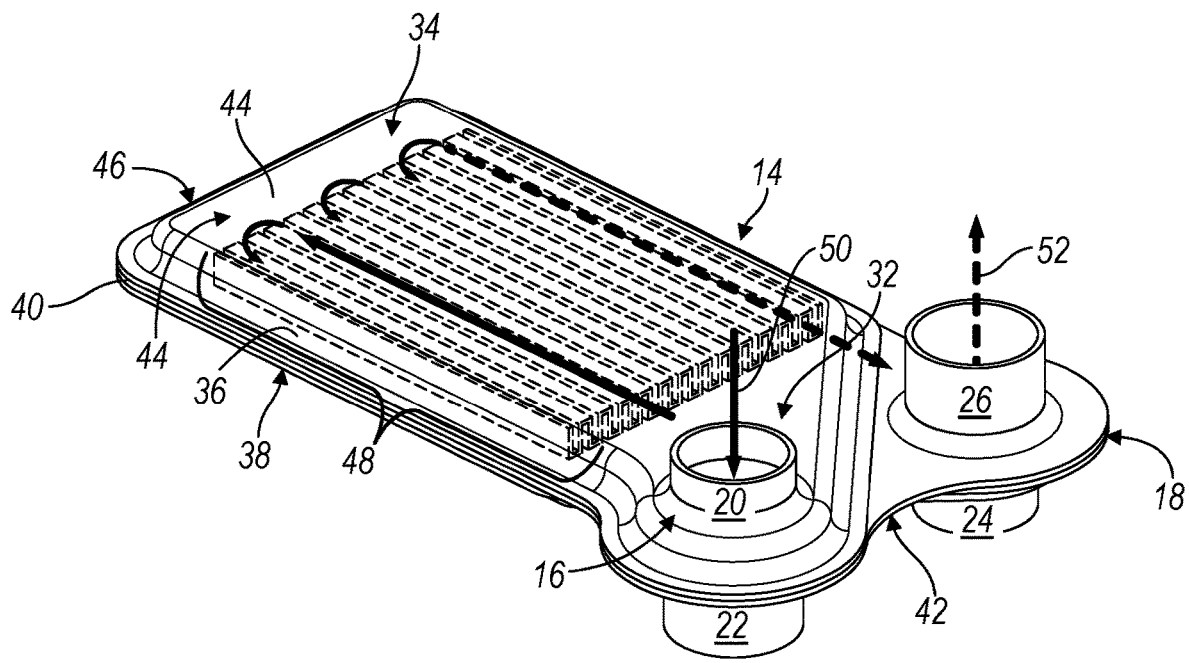
FIG. 6 is another perspective view depicting an implementation of a planar cooling chamber.
Figure 7A:
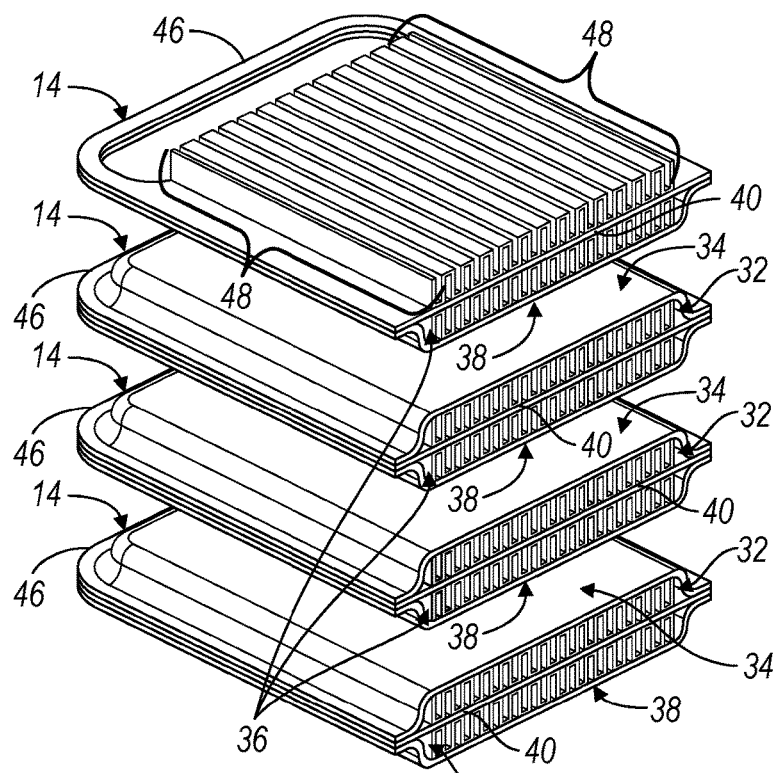
FIG. 7a is a cross-sectional view depicting an implementation of planar cooling chambers.
Figure 7B:
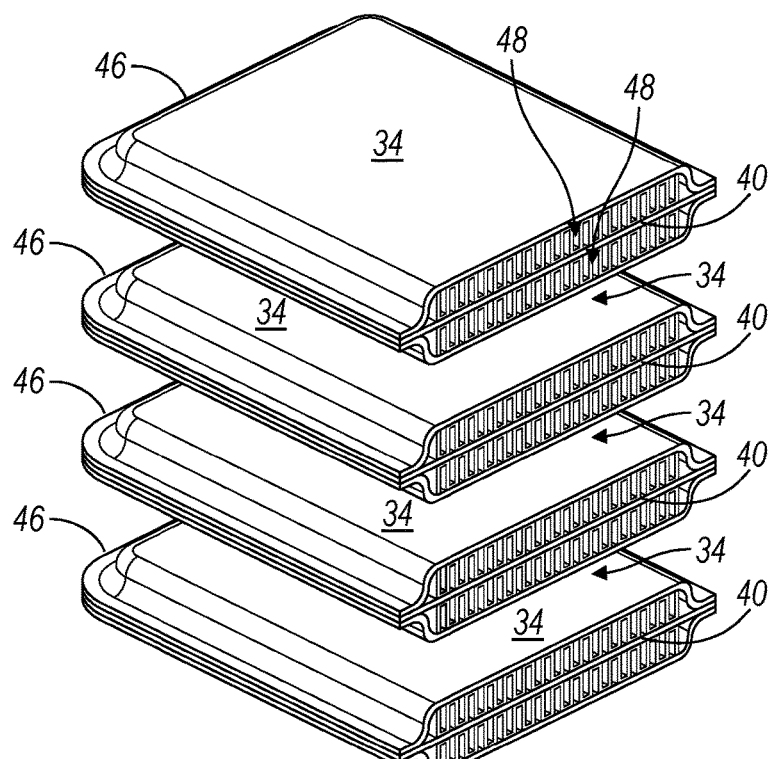
FIG. 7b is a cross-sectional view depicting an implementation of planar cooling chambers.

An implementation of a cooling manifold assembly 10 for cooling power modules 12 is shown in FIGS. 1-3. The assembly 10 includes a plurality of planar cooling chambers 14 that are fluidly connected together via supply inlets 16 and return outlets 18. The quantity of planar cooling chambers 14 can be selected based on the quantity of power modules 12 to be included or cooled with the assembly 10. In this implementation, seven planar cooling chambers 14 are included in the assembly 10, however, it should be appreciated that as few as two could be used to create a cooling manifold assembly. The planar cooling chambers 14 can be stacked vertically in the Z-direction. Adjacent cooling chambers 14 can be connected by the supply inlets 16 and the return outlets 18. The supply inlet 16 of each planar cooling chamber 14 can include a supply fluid inlet 20 and a supply fluid outlet 22; the return outlet 18 can include its own return fluid inlet 24 and return fluid outlet 26. The supply fluid outlet 22 can be coupled with the supply fluid inlet 20 of an adjacent planar cooling chamber 14. For example, the assembly 10 shown in FIGS. 1-3 depict the planar cooling chambers 14a-14g from top to bottom. The supply inlet 16a of the top planar cooling chamber 14a includes a supply fluid inlet 20a that receives cooling fluid from a fluid source (not shown). The supply fluid inlet 20a can be coupled with a tubular connector 27, such as a metal tubing section, that may be configured to connect with the fluid source. In this implementation, the tubular connector is shown at the top of the assembly 10, but, in other different implementations the tubular connectors could be positioned at the bottom of the assembly. Other shaped tubular connectors could also be used having different cross-sectional shapes and angular articulations, such as elbow fittings. In one implementation, the cooling fluid can be coolant used by an internal combustion engine (ICE), but other cooling fluids are possible. The supply fluid outlet 22a can couple with the supply fluid inlet 20b of the adjacent planar cooling chamber 14b. These connections can continue downward along the Z-axis to the bottom planar cooling chamber 14g, which can have an end cap 29 cover the supply fluid outlet 22g.

The return outlet 18g of the planar cooling chamber 14g includes a return fluid inlet 24 that can be covered with an end cap. The return fluid outlet 26g can couple with the return fluid inlet 26f of the adjacent planar cooling chamber 14f. Similar connections between return fluid outlets 26 and return fluid inlets 24 of adjacent planar cooling chambers 14 can continue from the bottom planar cooling chamber 14g extending along the Z-axis to the top planar cooling chamber 14a and the cooling fluid from the assembly 10 can exit via the return fluid outlet 26a and a tubular connector 27. The connections between adjacent supply inlets and return outlets can be established by soldering or brazing the connections. For example, the planar cooling chambers 14 can be made from an aluminum alloy, such as 3300, and the inlets and outlets 20, 22, 24, 26 may be brazed together so that the connections are fluid tight and also rigidly held together by the soldering or brazing. However, it should be appreciated that other fluid-tight connections that mechanically bind adjacent planar cooling chambers 14 are possible. The planar cooling chambers 14 can be combined or otherwise assembled prior to insertion or inclusion of the power modules 12. For example, the planar cooling chambers 14a-14g can be coupled together and, afterwards, the power modules 12 can be inserted in between adjacent planar cooling chambers 14. After the power modules 12 have been inserted, a compressive spring 28 can squeeze the assembly 10 together providing force inward toward the power modules 12 on an outside surface of planar cooling chamber 14a and an outside surface of planar cooling chamber 14g. The compressive spring 28 can be a clamp, such as a bolt and nut combination, a screw with lever, or other similar compressive mechanical device to name a few possible implementations. Power modules 12 having different thicknesses can be accommodated by being placed between different adjacent planar cooling chambers 14. A pressure distributor 30 can be positioned in between an outer surface of the planar cooling chamber 14 and the power module(s) 12. The pressure distributor 30 can help distribute load applied by the compressive spring 28. In one implementation, the pressure distributor can be a sheet or plate of metal, the thickness and material can be selected depending on application. Steel and Aluminum are possible materials. In other implementations, the gauge or thickness of the material used to form the outer surface of the planar cooling chamber 14 can be relatively thicker and the assembly can omit the pressure distributor. The planar cooling chambers 14 can be press-formed.

The cooling fluid enters the supply inlet 16a of the top planar cooling chamber 14a and flows in a supply direction 50—in this implementation downward in the Z-direction—toward planar cooling chamber 14b and supply inlets 14b-14g. The cooling fluid then begins flowing through the supply chambers 32 of planar cooling chambers 14a-14g toward the distal ends 46 in a direction substantially perpendicular to the supply direction 50. Cooling fluid flow from supply inlet 16a to supply inlet 16g flows in the supply direction 50 to provide cooling fluid for each of the planar cooling chambers 14a-14g. The cooling fluid then enters the return chambers 36 of planar cooling chambers 14a-14g through the openings 44 and then begins travelling back toward the proximate ends 42 of the planar cooling chambers 14a-14g in a direction substantially perpendicular to the supply direction 50 where the fluid can reach the return outlets 18a-18g. The cooling fluid can then flow in a return direction 52 that is substantially opposite to the supply direction 50 and exit the assembly 10. In other embodiments, the flow of fluid can be substantially the same direction as the supply direction.

An implementation of an individual planar cooling chamber 14 is shown in FIGS. 5-6 and 7a-7b. The planar cooling chamber 14 includes a supply chamber 32 in an upper portion 34 of the chamber 14 and a return chamber 36 in a lower portion 38 of the chamber 14. A dividing plate 40 can separate the supply chamber 32 from the return chamber 36 within the planar cooling chamber 14 in between the upper portion 34 and the lower portion 38. The planar cooling chamber 14 is configured to couple with one or two other adjacent planar cooling chambers 14 at a proximate end 42 of the module via the supply inlet 16 and the return outlet 18. For example, a supply fluid outlet 22 can connect to a supply fluid inlet 20 and a return fluid outlet 26 can connect with a return fluid inlet 24, as discussed above. The dividing plate 40 can permit the supply chamber 32 to fluidly connect with the return chamber 36 through an opening 44 at a distal end 46 of the planar cooling chamber 14 located opposite the proximate end 42. Cooling fluid can be supplied to the supply inlet 16 located at the proximate end 42, which is in fluid communication with the supply chamber 32. The supply chamber 32 can have a plurality of cooling fins 48 that span a distance vertically from top to bottom in the Z-direction and extend along the Y-axis within the supply chamber 32 in between the proximate end 42 and the distal end 46 to the opening 44. The return chamber 36 can also include the plurality of cooling fins 48 that span a distance vertically from top to bottom in the Z-direction and extend along the Y-axis within the return chamber 36 in between the proximate end 42 and the distal end 46 to the opening 44.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

What is claimed is:

1. A cooling manifold assembly that is configured to cool power modules in a vehicle, comprising:
    a planar cooling chamber, with a supply inlet and a return outlet, and an outer surface configured to abut a power module;
    a supply chamber in an upper portion of the planar cooling chamber, extending substantially perpendicular to the supply inlet or the return outlet along an outer surface of the power module, that is in fluid communication with the supply inlet and configured to couple to adjacent planar cooling chambers at the supply inlet;
    a return chamber in a lower portion of the planar cooling chamber, extending substantially perpendicular to the supply inlet or the return outlet along an outer surface of another power module, that is in fluid communication with the return outlet and configured to couple to adjacent planar cooling chambers at the return outlet, such that the planar cooling chamber is configured to be positioned between the power modules; and
    an opening at a distal end of the planar cooling chamber fluidly connecting the supply, chamber with the return chamber, wherein the supply chamber and the return chamber flow coolant in a direction substantially perpendicular to a flow of coolant of the supply inlet and the return outlet.

2. The cooling manifold assembly recited in claim 1, wherein the supply inlet is configured to flow cooling fluid in a supply direction that is substantially perpendicular to a flow of cooling fluid toward a distal end of the planar cooling chamber and the return outlet flows cooling fluid in a return direction that is substantially opposite of the supply direction.

3. The cooling manifold assembly recited in claim 1, further comprising a plurality of cooling fins in the supply chamber and the return chamber.

4. The cooling manifold assembly recited in claim 1, further comprising a pressure distributor on an outer surface of the planar cooling chamber.

5. The cooling manifold assembly recited in claim 1, wherein the supply inlet further comprises a supply fluid inlet and a supply fluid outlet.

6. The cooling manifold assembly recited in claim 1, wherein the return outlet further comprises a return fluid inlet and a return fluid outlet.

7. The cooling manifold assembly recited in claim 5, further comprising an end cap coupled to the supply fluid outlet.

8. The cooling manifold assembly recited in claim 6, further comprising an end cap coupled to the return fluid inlet.

9. The cooling manifold assembly recited in claim 1, wherein the supply inlet and the return outlet are each located at a proximate end of the planar cooling chamber.

10. A cooling manifold assembly that is configured to cool power modules in a vehicle, comprising:
    a first planar cooling chamber, with an outer surface configured to abut a first power module, including:
        a first supply inlet having a first supply fluid inlet and a first supply fluid outlet, and a first return outlet having a first return fluid inlet and a first return fluid outlet, each located at a proximate end of the first planar cooling chamber;
        a first supply chamber in an upper portion of the first planar cooling chamber, extending substantially perpendicular to the first supply inlet, that is in fluid communication with the first supply inlet;
        a first return chamber in a lower portion of the first planar cooling chamber, extending substantially perpendicular to the first return outlet along an outer surface of the first power module, that is in fluid communication with the first return outlet;
        an opening at a distal end of the first planar cooling chamber fluidly connecting the first supply chamber with the first return chamber, wherein the first supply chamber and the first return chamber flow coolant in a direction substantially perpendicular to a flow of coolant of the first supply fluid inlet, first supply fluid outlet, the first return fluid inlet, and the first return fluid outlet;
    a second planar cooling chamber, with an outer surface configured to abut the first power module and a second power module, including:
        a second supply inlet having a second supply fluid inlet coupled with the first supply fluid outlet and a second supply fluid outlet, and a second return outlet having a second return fluid outlet coupled with the first return fluid inlet and a second return fluid inlet, each located at a proximate end of the second planar cooling chamber;
        a second supply chamber in an upper portion of the second planar cooling chamber, extending substantially perpendicular to the second supply inlet along an outer surface of the first power module, that is in fluid communication with the second supply inlet;
        a second return chamber in a lower portion of the second planar cooling chamber, extending substantially perpendicular to the second return outlet along an outer surface of the second power module, that is in fluid communication with the second return outlet; and
        an opening at a distal end of the second planar cooling chamber fluidly connecting the second supply chamber with the second return chamber, wherein the second supply chamber and the second return chamber flow coolant in a direction substantially perpendicular to a flow of coolant of the second supply fluid inlet, second supply fluid outlet, the second return fluid inlet, and the second return fluid outlet.

11. The cooling manifold assembly recited in claim 10, wherein the first supply inlet and the second supply inlet are configured to flow cooling fluid in a supply direction that is substantially perpendicular to a flow of cooling fluid toward a distal end of the planar cooling chambers and the first return outlet and second return outlet flow cooling fluid in a return direction that is substantially opposite of the supply direction.

12. The cooling manifold assembly recited in claim 10, further comprising a plurality of cooling fins in the first supply chamber, the second supply chamber, the first return chamber, and the second return chamber.

13. The cooling manifold assembly recited in claim 10, further comprising a pressure distributor on an outer surface of the first planar cooling chamber and a pressure distributor on an outer surface of the second planar cooling chamber abutting opposite sides of a power module.

14. The cooling manifold assembly recited in claim 10, further comprising an end cap coupled to the second supply fluid outlet and an end cap coupled to the second return fluid inlet.

15. The cooling manifold assembly recited in claim 10, further comprising a compressive spring engaging an outer surface of the first planar cooling chamber and an outer surface of the second planar cooling chamber that compresses one or more power modules between the first planar cooling chamber and the second planar cooling chamber.

16. A cooling manifold assembly that is configured to cool power modules in a vehicle, comprising:
    a first planar cooling chamber, with an outer surface configured to abut a first power module including:
        a first supply inlet having a first supply fluid inlet and a first supply fluid outlet, and a first return outlet having a first return fluid inlet and a first return fluid outlet, each located at a proximate end of the first planar cooling chamber;
        a first supply chamber in an upper portion of the first planar cooling chamber, extending substantially perpendicular to the first supply inlet, that is in fluid communication with the first supply inlet;
        a first return chamber in a lower portion of the first planar cooling chamber, extending substantially perpendicular to the first return outlet along an outer surface of the first power module, that is in fluid communication with the first return outlet;
        an opening at a distal end of the first planar cooling chamber fluidly connecting the first supply chamber with the first return chamber, wherein the first supply chamber and the first return chamber flow coolant in a direction substantially perpendicular to a flow of coolant of the first supply fluid inlet, first supply fluid outlet, the first return fluid inlet, and the first return fluid outlet;
    a second planar cooling chamber, with an outer surface configured to abut e first power module and a second power module, including:
        a second supply inlet having a second supply fluid inlet coupled with the first supply fluid outlet and a second supply fluid outlet, and a second return outlet having a second return fluid outlet coupled with the first return fluid inlet and a second return fluid inlet, each located at a proximate end of the second planar cooling chamber;
        a second supply chamber in an upper portion of the second planar cooling chamber, extending substantially perpendicular to the second supply inlet along an outer surface of the first power module, that is in fluid communication with the second supply inlet;
        a second return chamber in a lower portion of the second planar cooling chamber, extending substantially perpendicular to the second return outlet along an outer surface of the second power module, that is in fluid communication with the second return outlet;
        an opening at a distal end of the second planar cooling chamber fluidly connecting the second supply chamber with the second return chamber, wherein the second supply chamber and the second return chamber flow coolant in a direction substantially perpendicular to a flow of coolant of the second supply fluid inlet, second supply fluid outlet, the second return fluid inlet, and the second return fluid outlet; and
    a compressive spring engaging an outer surface of the first planar cooling chamber and an outer surface of the second planar cooling chamber that compresses one or more power modules between the first planar cooling chamber and the second planar cooling chamber.

17. The cooling manifold assembly recited in claim 16, wherein the first supply inlet and the second supply inlet are configured to flow cooling fluid in a supply direction that is substantially perpendicular to a flow of cooling fluid toward a distal end of the planar cooling chambers and the first return outlet and second return outlet flow cooling fluid in a return direction that is substantially opposite of the supply direction.

18. The cooling manifold assembly recited in claim 16, further comprising a plurality of cooling fins in the first supply chamber, the second supply chamber, the first return chamber, and the second return chamber.

19. The cooling manifold assembly recited in claim 16, further comprising an end cap coupled to the second supply fluid outlet and an end cap coupled to the second return fluid inlet.

20. The cooling manifold assembly recited in claim 16, further comprising a pressure distributor on an outer surface of the first planar cooling chamber or on an outer surface of the second planar cooling chamber.

* * * * *